United States Patent
Coronel et al.

(10) Patent No.: US 8,674,443 B2
(45) Date of Patent: Mar. 18, 2014

(54) SUBSTRATE PROVIDED WITH A SEMI-CONDUCTING AREA ASSOCIATED WITH TWO COUNTER-ELECTRODES AND DEVICE COMPRISING ONE SUCH SUBSTRATE

(75) Inventors: Philippe Coronel, Barraux (FR); Claire Fenouillet-Beranger, Saint Martin d'Heres (FR); Stephane Denorme, Crolles (FR); Olivier Thomas, Revel (FR)

(73) Assignees: Commissariat à l'Energie Atomique et aux Energies Alternatives, Paris (FR); STMicroelectronics (Crolles 2) SAS, Crolles (FR)

( * ) Notice: Subject to any disclaimer, the term of this patent is extended or adjusted under 35 U.S.C. 154(b) by 194 days.

(21) Appl. No.: 13/164,164

(22) Filed: Jun. 20, 2011

(65) Prior Publication Data
US 2011/0316055 A1    Dec. 29, 2011

(30) Foreign Application Priority Data
Jun. 24, 2010   (FR) ...................................... 10 02657

(51) Int. Cl.
*H01L 27/12*   (2006.01)

(52) U.S. Cl.
USPC ......................................... 257/347; 257/351

(58) Field of Classification Search
USPC .................................................. 257/351, 347
See application file for complete search history.

(56) References Cited

U.S. PATENT DOCUMENTS

| | | | |
|---|---|---|---|
| 6,072,217 A * | 6/2000 | Burr | 257/351 |
| 6,724,045 B1 * | 4/2004 | Ushiku | 257/347 |
| 2006/0027877 A1 | 2/2006 | Inaba | |
| 2007/0187769 A1 | 8/2007 | Anderson et al. | |

OTHER PUBLICATIONS

Khater et al., "FDSOI CMOS with Dielectrically-Isolated Black Gates and 30nm $L_G$ High-κ/Metal Gate," *Symposium on VLSI Technology Digest of Technical Papers*, 2010, pp. 43-44, IEEE.

* cited by examiner

*Primary Examiner* — Howard Weiss
*Assistant Examiner* — Steven Rao
(74) *Attorney, Agent, or Firm* — Oliff PLC

(57) ABSTRACT

A support substrate comprises first and second counter-electrodes arranged in the same plane at the level of a surface of the support substrate. An electrically insulating area separates the first and second counter-electrodes. A semi-conducting area with first and second portions is separated from the support substrate by an electrically insulating material. The electrically insulating material is different from the material forming the support substrate. The first portion of the semi-conducting area is facing the first counter-electrode. The second portion of the semi-conducting area is facing the second counter-electrode.

11 Claims, 4 Drawing Sheets

"Related Art"

SUBSTRATE PROVIDED WITH A SEMI-CONDUCTING AREA ASSOCIATED WITH TWO COUNTER-ELECTRODES AND DEVICE COMPRISING ONE SUCH SUBSTRATE

BACKGROUND OF THE INVENTION

The invention relates to a substrate provided with an active area separated from a support substrate by an electrically insulating layer and to the method for producing this substrate.

STATE OF THE ART

In order to palliate increasingly present parasite effects, field effect devices have incorporated a counter-electrode, i.e. a second electrode which presents an electrostatic effect on the conduction channel.

This architecture is generally associated with devices produced on substrates of semi-conductor on insulator type in which a layer of semi-conductor material is separated from a support substrate by a buried dielectric material.

If the support substrate is conducting or if it presents an area having a sufficient conductivity, it is possible to assimilate this substrate to a quasi gate electrode. As the materials and dimensions of this architecture are not optimized, what is involved is not a second gate electrode but an electrode that is able to modify the performances of the field effect device.

As illustrated in FIG. 1, substrate 1 comprises a support substrate 2 covered by an insulating material layer 3 and a semi-conductor material layer 4. Support substrate 2 comprises a counter-electrode 5 facing an active area of semi-conductor material layer 4. The active semi-conductor material area and its associated counter-electrode are surrounded by an insulating pattern 9 so as to limit the influence of the counter-electrode on the adjacent devices and prevent leakage with the other counter-electrodes.

Although this device presents numerous advantages, it is associated with an increased complexity to produce as there is an additional electrode. Furthermore, certain applications are difficult to achieve with transistors with a counter-electrode.

In memory cells, it is important to have the greatest possible compactness. To achieve this result, positioning of the different transistors and the form of the multiple technological bricks such as the gate pattern or active area pattern is the subject of a large number of studies. Under these conditions, the use of a transistor with counter-electrode is extremely complex to set up.

OBJECT OF THE INVENTION

It is observed that a need exists to provide a substrate comprising an active area associated in compact manner with a plurality of future counter-electrodes.

The device according to the invention is characterized in that it comprises:
  a support substrate,
  first and second counter-electrodes arranged in the same plane at the level of a surface of the support substrate,
  an electrically insulating area separating the first and second counter-electrodes,
  a semi-conducting area comprising first and second portions,
  the first portion of the semi-conducting area facing the first counter-electrode,
  the second portion of the semi-conducting area facing the second counter-electrode,
  an electrically insulating material separating the semi-conducting area from the support substrate, the electrically insulating material being different from the material forming the support substrate.

It is also observed that there is a need to provide a method for producing a substrate that is easy to implement.

The method is characterized in that it comprises the following steps:
  providing a support substrate successively covered by an insulating layer and a semi-conducting layer,
  providing a counter-electrode material arranged at the level of a surface of the support substrate and covered by the insulating layer and the semi-conducting layer,
  etching the semi-conducting layer and the insulating layer to leave a semi-conducting area facing the counter-electrode material in the semi-conducting layer,
  etching a part of the support substrate facing the semi-conducting area so as to form an electrically insulating area separating two parts of the counter-electrode material.

BRIEF DESCRIPTION OF THE DRAWINGS

Other advantages and features will become more clearly apparent from the following description of particular embodiments of the invention given for non-restrictive example purposes only and represented in the appended drawings, in which.

DESCRIPTION OF A PREFERRED EMBODIMENT OF THE INVENTION

Figure 1:
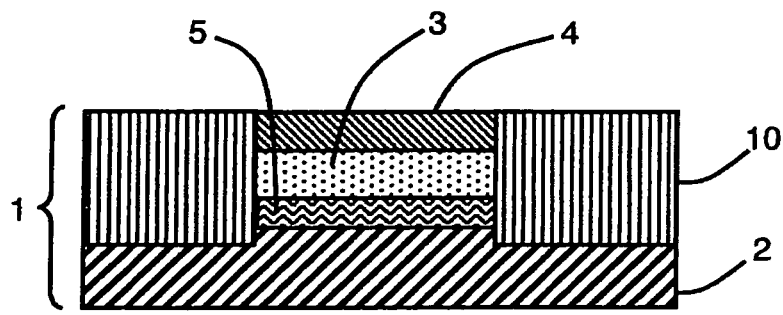
FIG. 1 represents an active area associated with a counter-electrode according to the prior art, in schematic manner in cross-section.
Figure 2:
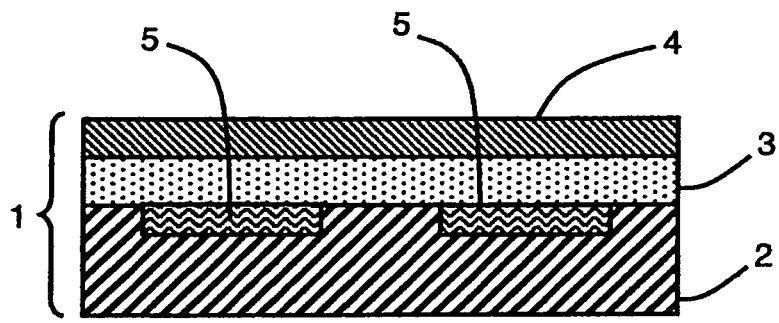
FIGS. 2, 3 and 5 to 7 represent different steps of a first method for producing a substrate, in schematic manner in cross-section along AA.
Figure 3:
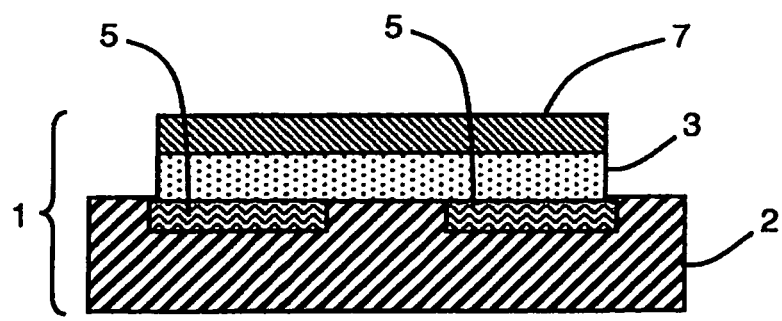
Figure 4:
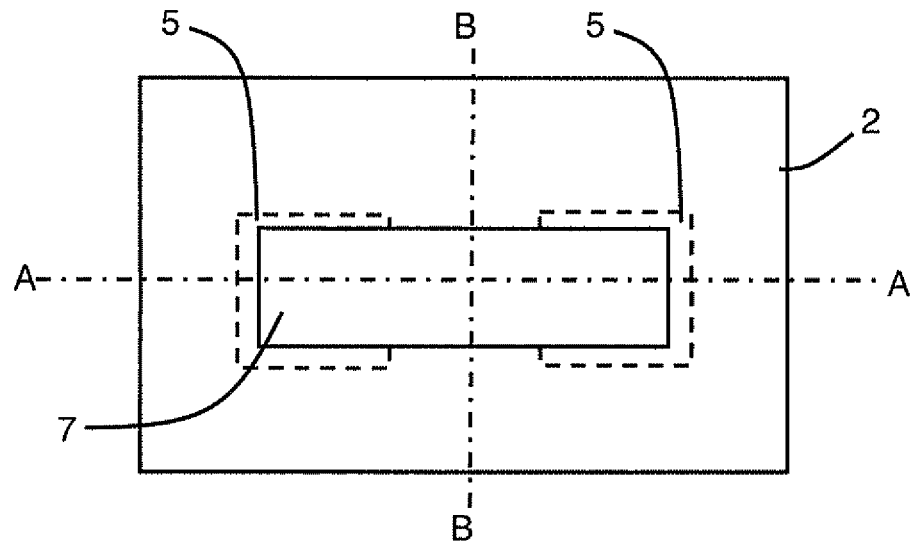
FIG. 4 represents a schematic top view of a substrate according to FIG. 3, FIGS. 8 to 10 represent different steps of a second method for producing a substrate, in schematic manner in cross-section along AA.

FIGS. 2, 3, 5 to 10 and 12 represent cross-sectional views along line AA of FIG. 4. FIG. 11 represents a cross-sectional view along line BB of FIG. 4.

As illustrated in FIG. 2, the initial substrate 1 is of semi-conductor on insulator type and comprises a support substrate 2, an insulating layer 3 made from electrically insulating material and an active layer 4 made from semi-conductor material. Insulating layer 3 of electrically insulating material separates support substrate 2 from active semi-conductor material layer 4. Support substrate 2 is for example a silicon substrate or another substrate made from monocrystalline or polycrystalline semi-conductor material. The electrically insulating material of insulating layer 3 is a different material from that of support substrate 2.

Support substrate 2 comprises a counter-electrode 5 or a plurality of counter-electrodes 5, typically two counter-electrodes or more. A counter-electrode 5 is an area of weak resistivity compared with the rest of support substrate 2. A counter-electrode 5 can be formed by doping support substrate 2 or by integration of a more conductive material, for example a metal material, on the surface or in support substrate 2.

Support substrate 2 can also comprise a counter-electrode material, i.e. a material able to form a counter-electrode 5 or to be modified to form a counter-electrode 5. If support substrate 2 is made from silicon, it is formed in a counter-electrode material as the latter simply has to be doped to create one or more counter-electrodes 5. Counter-electrode 5 can therefore be formed at different stages of the production method. The description therefore deals with already formed counter-electrodes 5 for ease of understanding, although it is possible to form these counter-electrodes later on in the process.

Figure 12:
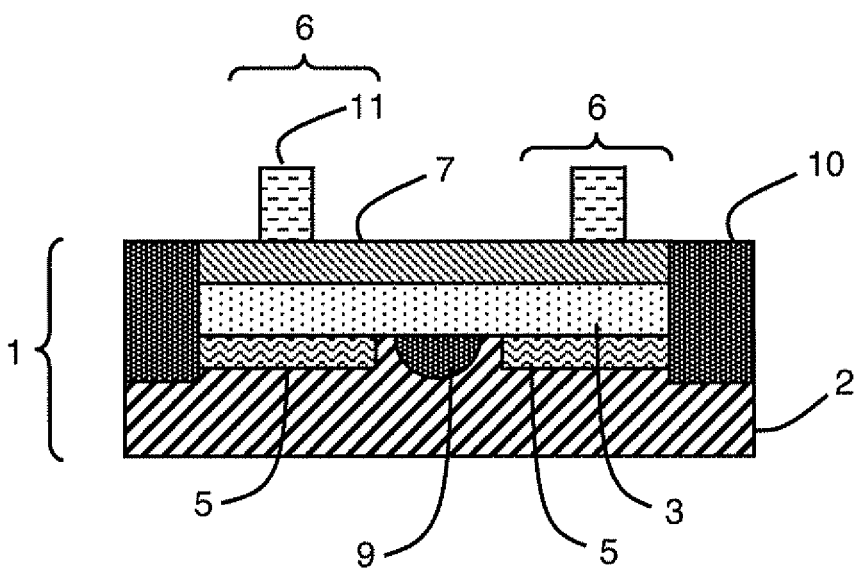
FIG. 12 represents transistors integrated in a substrate, in schematic manner in cross-section along AA.

A counter-electrode 5 can be associated with a field effect transistor 6 or with a plurality of field effect transistors 6 (see FIG. 12). Counter-electrode 5 formed in support substrate 2 is characterized by its action surface, i.e. its surface in an interface plane parallel to the interface between support substrate 2 and insulating layer 3. It is also characterized by its thickness, i.e. its dimension in the direction perpendicular to this interface plane. It is further characterized by its depth, i.e. its shortest distance up to a portion of an associated semi-conducting area 7 (represented in FIG. 3).

In preferred manner, the two counter-electrodes 5 present the same thickness and the same depth, however, depending on unforeseen hazards of the fabrication method or depending on requirements, it is possible to have counter-electrodes 5 with different characteristics both as far as the depth of counter-electrode 5 and its thickness are concerned. It is therefore conceivable to have two counter-electrodes 5 having different thicknesses i.e. that belong to two different planes, each plane being parallel to the surface of the substrate.

The two electrodes are not on top of one another but beside one other, i.e. they are offset laterally. The counter-electrodes can then be considered to define a plane that is not compulsorily parallel to the plane containing the semi-conducting area.

As illustrated in FIG. 3, semi-conducting layer 4 and insulating layer 3 are patterned by any suitable etching technique to form an area salient from the surface of support substrate 2. Patterning of semi-conducting layer 4 leaves a semi-conducting active area 7 of semi-conductor material in this layer 4. This active area 7 is made from the same material as semi-conducting layer 4.

Semi-conducting area 7 is preferably monocrystalline, i.e. it is formed by a single crystal. There is therefore continuity of the crystal lattice from one end of semi-conducting area 7 to the other. Active area 7 is separated from support substrate 2 by insulating layer 3.

Insulating layer 3 is also patterned with an identical or similar pattern to that of active area 7. Patterning of insulating layer 3 (for example by etching) enables a part of support substrate 2 to be uncovered. Patterning of semi-conducting layer 4 and of insulating layer 3 can also partly uncover one or more counter-electrode 5.

Figure 8:
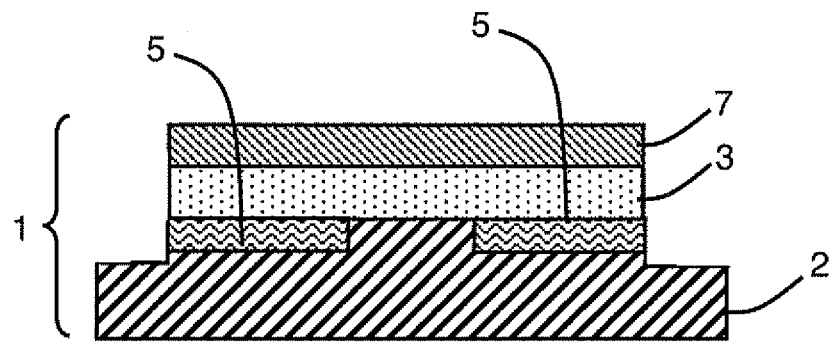

If patterning of insulating layer 3 is extended in support substrate 2, the portions of uncovered counter-electrodes 5 can be eliminated, which enables the external edges of active area 7 and of the associated counter-electrode to be self-aligned, as illustrated in FIG. 8.

When semi-conducting layer 4 and insulating layer 3 are etched, an active area is formed salient from support substrate 2.

As illustrated in FIG. 4 in top view, semi-conducting active area 7 is facing one or two counter-electrodes 5 of support substrate 2, i.e. they are overlapping one another. At least one counter-electrode 5 is thus at least partly covered by a portion of insulating layer 3 and a part of active area 7.

Figure 5:
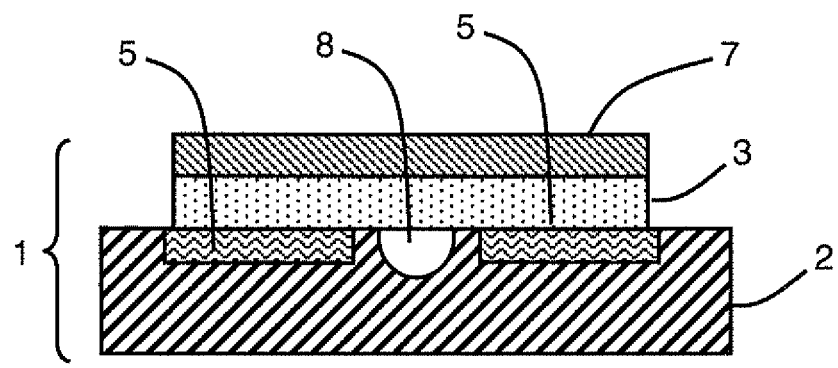

As illustrated in FIG. 5, support substrate 2 is then etched so as to form an electrically insulating void area 8 between two parts of the counter-electrode material in support substrate 2, underneath the active area, i.e. between two future counter-electrodes. This patterning is performed by any suitable technique, typically by means of isotropic etching. Depending on the nature of the material to be eliminated with respect to the other materials in presence, different approaches are possible. The material to be eliminated can be the material forming the support substrate and/or the material of counter-electrode 5, whether it is the material forming support substrate 2 or not.

In a first particular embodiment, localized etching of support substrate 2 is performed by transformation of a part of the material present at the surface of support substrate 2. This transformation subsequently makes it possible to perform selective etching of this new material with respect to that initially forming support substrate 2 and/or the counter-electrode material. This transformation is performed for example by implantation of a dopant material that is electrically active or not. This transformation allows a selective etching chemistry to be used with respect to the materials present.

In a second particular embodiment, a part of the surface of support substrate 2 is protected by means of a protective mask. The part of the material of support substrate 2 and/or of the counter-electrode that is left uncovered is subsequently eliminated by means of an etching agent. This isotropic etching can be obtained for example by liquid means or by gaseous means.

Patterning of support substrate 2 enables the latter to be eliminated in a part situated between two portions of counter-electrode material, in particular underneath the active area. This step enables the direct electric connection between the two counter-electrodes 5 to be eliminated or reduced.

Depending on the potentials applied to counter-electrodes 5, the extent of electrically insulating void area 8 can vary in order to block the field lines. If strong potentials are applied, the void area can extend more deeply than the two counter-electrodes 5. The void area extends at least from the interface with the electrically insulating material layer to a depth equivalent to that of the deepest counter-electrode.

In a particular embodiment, not represented, electrically insulating void area 8 can be coupled to additional stray current blocking means. These blocking is means take the form for example of doped areas in semi-conductor support substrate 2. One or more diodes are then formed, which block the short-circuit currents. These doped areas are advantageously formed by ion implantation.

In an alternative embodiment that can be combined with the previous embodiments, insulating layer 3 is partially eliminated.

Figure 6:
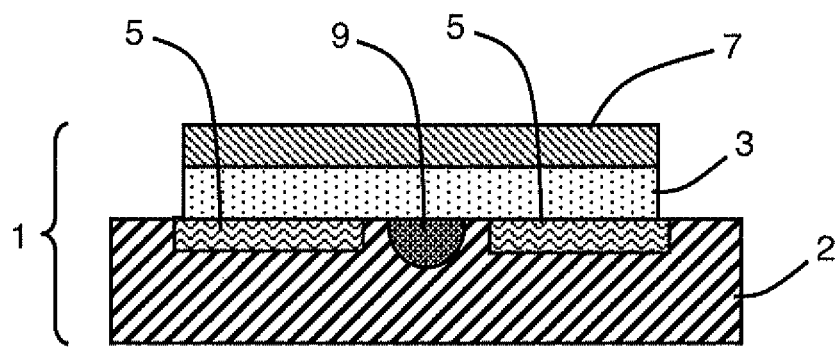

As illustrated in FIG. 6, electrically insulating void area 8 underneath semi-conducting area 7 can be filled by an electrically insulating material, for example a silicon oxide, a silicon nitride or an insulator with a higher dielectric constant such as $HfO_2$ to form an electrically insulating full area 9. The electrically insulating material is deposited so as to at least partly fill the void area. In advantageous manner, the insulating material is then patterned so as to be localized in interesting areas, typically underneath the active area separating the two counter-electrodes.

Figure 7:
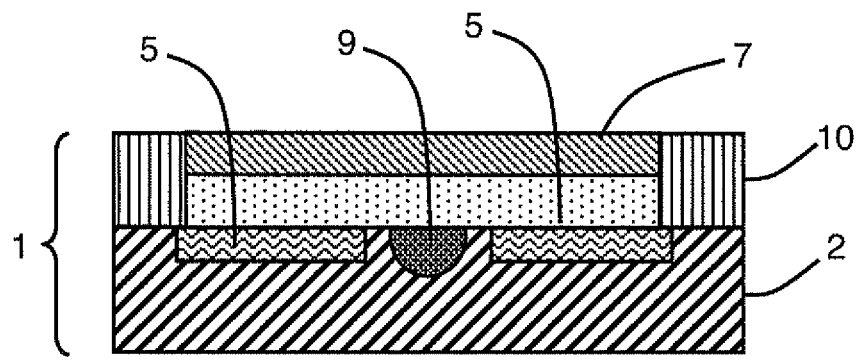

In a particular embodiment illustrated in FIG. 7, an insulating pattern 10 is formed to enhance the strength of the structure and the electric insulation. Insulating pattern 10 surrounds active area 7. It forms a closed peripheral pattern around active area 7 that covers support substrate 2 and the side walls of active area 7 and of insulating layer 3.

In a particular embodiment able to be combined with the previous embodiments and illustrated in FIG. 8, patterning of semi-conducting layer 4 and of insulating layer 3 is continued by patterning of the top part of support substrate 2. In this way, an area salient from support substrate 2 is formed along with an access to the lateral surfaces of the salient area to form electrically insulating area 8.

In a preferred embodiment, etching of support substrate 2 is performed from the opposite lateral surfaces of the area salient from support substrate 2. This reduces the etching time as well as reducing stray etching in the other directions. It is also possible to perform etching from one side of the salient structure only.

Figure 9:
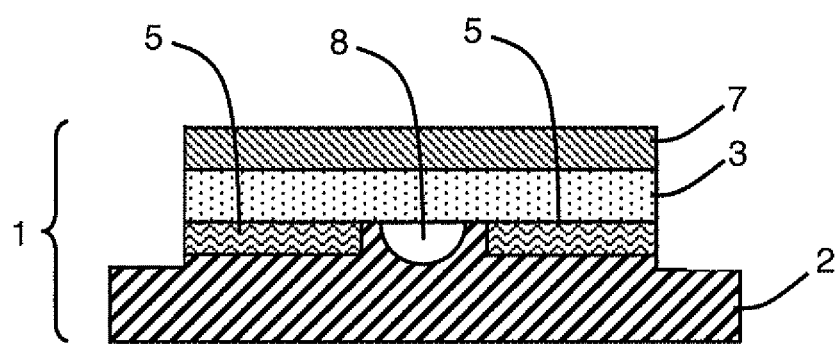

As illustrated in FIG. 9, once partial etching of support substrate 2 has been performed, the active area is still secured to support substrate 2, but it comprises an area released from support substrate 2, a suspended area. By means of the void area created in support substrate 2, there is no longer any direct electric contact between the two counter-electrodes, which depending on the case enables short-circuits to be eliminated or reduced. This void area forms an electrically insulating area 8 which uncovers a part of the interface between insulating layer 3 and support substrate 2 and which separates the two counter-electrodes 5. In this case, electrically insulating area 8 is separated from semi-conducting area 7 by insulating layer 3.

Figure 10:
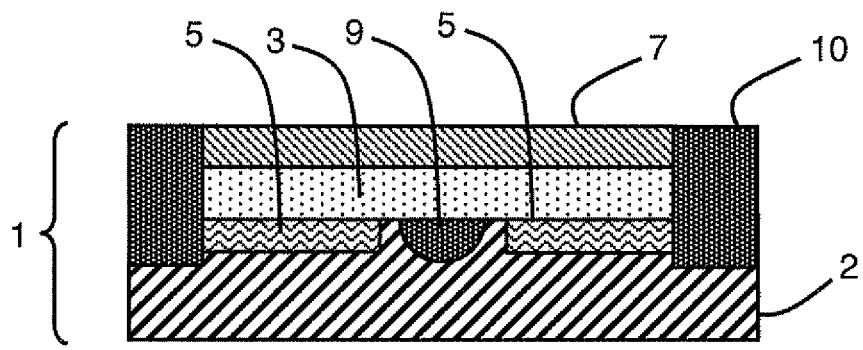
Figure 11:
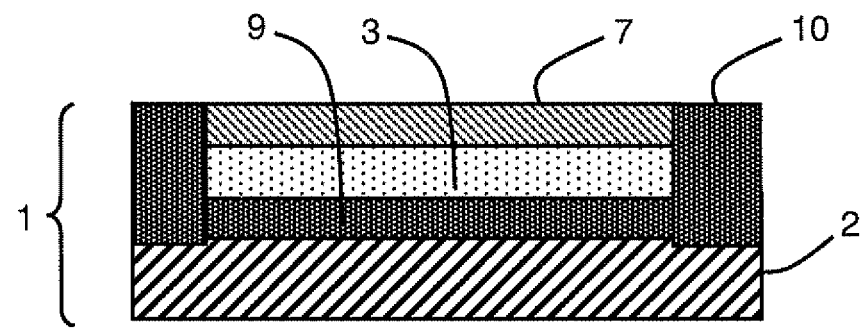
FIG. 11 represents a substrate according to FIG. 10, in schematic manner in cross-section along BB.

In an alternative embodiment illustrated in FIG. 10 and which can be combined with the previous embodiments, the electrically insulating material of area 9 is the same as that able to be used for insulating pattern 10. The electrically insulating material fills insulating area 8 underneath the active area and forms insulating pattern 10 all around active area 7. Formation of insulating pattern 10 and filling of electrically insulating area 9 are simultaneous.

In this way, an advantageously monocrystalline monoblock active area 7 is obtained surrounded by a closed peripheral insulating pattern 10. This active area 7 is associated with at least two electrically independent counter-electrodes 5 arranged on a surface of support substrate 2. Each of counter-electrodes 5 is facing a particular portion of active area 7. Here the first portion is facing first counter-electrode 5 and the second portion is facing second counter-electrode 5. The two portions of active area 7 are in the same plane and are laterally offset from one another.

Electric separation of the counter-electrodes is obtained by means of electrically insulating area 8, 9 separating the counter-electrodes. The lateral extent of area 8, 9 in the direction BB is thereby at least equal to that of the counter-electrodes. This electric separation can be improved by means of insulating pattern 10 which surrounds active area 7 and which can therefore partially surround counter-electrodes 5 (vertically) at the level of the side walls. Insulating pattern 10 can present a different depth sunk into the support substrate than that of insulating electrically area 8, 9. In this case, both of the counter-electrodes 5 are surrounded by closed peripheral electrically insulating material. The thickness of insulating pattern 10 around semi-conducting area 7 is different from the thickness of the electrically insulating material underneath semi-conducting area 7. As illustrated in FIG. 11 in a cross-section along the plane BB, electrically insulating area 9 joins insulating pattern 10.

Once the active area has been formed and the counter-electrodes have been formed, it is possible to form field effect transistors in conventional manner.

For example purposes illustrated in FIG. 12, first and second transistors 6 are formed on active area 7.

Each transistor 6 in conventional manner comprises a gate electrode 11 and two source/drain electrodes (not shown). The source/drain electrodes are formed in the active area on each side of the gate electrode.

First transistor 6 comprises a first gate electrode 11, a first conduction channel and one of counter-electrodes 5, the first counter-electrode. Second transistor 6 comprises a second gate electrode 11, a second conduction channel and the other of counter-electrodes, second counter-electrode 5. Each gate electrode is separated from the conduction channel by a gate insulator.

Each conduction channel is arranged between its gate electrode 11 and its associated counter-electrode 5. Each conduction channel is separated from gate electrode 11 and from counter-electrode 5 by a material that is electrically insulating, the gate insulator for gate electrode 11 and insulating layer 3 for counter-electrode 5. Each counter-electrode 5 has an electrostatic effect on its associated conduction channel. First and second counter-electrodes 5 are advantageously located in the same plane at the level of a surface of support substrate 2, which simplifies the fabrication method.

In this device, an active area 7 is associated with two different transistors 6, for example two transistors connected in series, and each transistor has its own counter-electrode 5. The counter-electrode contact is made independently for each counter-electrode 5 in order to ensure their electric independence.

In a particular embodiment, it is advantageous to form a single counter-electrode 5 before forming electrically insulating area 8, 9. This counter-electrode has a pattern in relation with that of the active area. The counter-electrode is then patterned when partial etching of support substrate 2 is performed to form a plurality of counter-electrodes, here first and second counter-electrodes 5.

At the outcome, a common active area 3 exists with two devices 6. Each of these two devices 6 is associated with a specific counter-electrode 5, i.e. each counter-electrode 5 is overlapping its associated device 6. Counter-electrodes 5 are electrically insulated from one another by electrically insulating area 8, 9. In this way, an active area provided with at least two active devices can also comprise counter-electrodes that are electrically dissociated due to electrically insulating area 8, 9.

In a particular embodiment, electrically insulating area 8, 9 is self-aligned with respect to the future transistors. In this embodiment, salient active area 7 is formed and surrounded by insulating pattern 10. Gate electrodes 11 are then formed on active area 7 and a part of insulating pattern 10.

Lateral spacers with the required dimension are made and then define the future position of electrically insulating area 8, 9. Insulating pattern 10 is etched with respect to the lateral spacers to free access to a part of the support substrate. The electrically insulating area is formed in support substrate 2.

The rest of the method is identical to that presented in the foregoing. The lateral position of electrically insulating area 8, 9 is thus defined between gate electrodes 11 by means of the lateral spacers and with respect to gate electrodes 11.

The invention claimed is:
1. A substrate comprising:
   a support substrate,
   first and second counter-electrodes arranged in a same plane on a surface of the support substrate, an electrically insulating area separating the first and second counter-electrodes,
a continuous monoblock semi-conducting area comprising first and second portions, the first portion of the continuous monoblock semi-conducting area overlapping the first counter-electrode and the second portion of the continuous monoblock semi-conducting area overlapping the second counter-electrode, and
an electrically insulating layer that separates the support substrate from the continuous monoblock semiconducting area, the electrically insulating layer containing electrically insulating material that is different from the material forming the support substrate.

2. The substrate according to claim 1, wherein the continuous monoblock semi-conducting area is monocrystalline.

3. The substrate according to claim 1, wherein the continuous monoblock semi-conducting area is surrounded by an insulating pattern made from an electrically insulating material.

4. The substrate according to claim 3, wherein the thickness of the insulating pattern around the continuous monoblock semi-conducting area is different from the thickness of the electrically insulating material underneath the continuous monoblock semi-conducting area.

5. The substrate according to claim 1, wherein the electrically insulating area is separated from the continuous monoblock semi-conducting area by the insulating layer.

6. A semi-conductor device comprising:
first and second field effect transistors arranged on a continuous monoblock semi-conducting area of a substrate according to claim 1,
the first transistor being provided with a first conduction channel and with a first gate electrode overlapping the first counter-electrode,
the second transistor being provided with a second conduction channel and with a second gate electrode overlapping the second counter-electrode.

7. The semi-conductor device according to claim 1, wherein the continuous monoblock semi-conducting area is monocrystalline.

8. A method for producing a substrate comprising the following steps:
providing a support substrate successively covered by an insulating layer and a semi-conducting layer,
providing a counter-electrode material arranged on a surface of the support substrate and covered by the insulating layer and the semi-conducting layer,
etching the semi-conducting layer and the insulating layer to form a continuous monoblock semi-conducting area overlapping the counter-electrode material in the semi-conducting layer and surrounded by a void space,
etching a part of the support substrate overlapping the continuous monoblock semi-conducting area so as to form an electrically insulating area separating two parts of the counter-electrode material.

9. The method according to claim 8 comprising filling the electrically insulating area by an electrically insulating material.

10. The method according to claim 8 comprising:
etching the electrically insulating material so as to localize the electrically insulating material overlapping the continuous monoblock semi conducting area and
forming an insulating pattern surrounding the continuous monoblock semi-conducting area.

11. A method for producing a substrate comprising the following steps:
providing a support substrate successively covered by an insulating layer and a semi-conducting layer,
providing a counter-electrode material arranged on a surface of the support substrate and covered by the insulating layer and the semi-conducting layer,
etching the semi-conducting layer and the insulating layer to form a continuous monoblock semi-conducting area overlapping the counter-electrode material in the semi-conducting layer and surrounded by a void space,
forming an insulating pattern surrounding the continuous monoblock semi-conducting area,
forming two gate electrodes on the continuous monoblock semi-conducting area and on the insulating pattern,
forming lateral spacers around the two gates electrodes
etching the insulating layer with respect to the lateral spacers and the gates electrodes so as to access a the support substrate,
etching a part of the support substrate overlapping the continuous monoblock semi-conducting area so as to form an electrically insulating area separating two parts of the counter-electrode material, the electrically insulating area being self aligned with the two gates electrodes.

* * * * *